United States Patent [19]

Blouke et al.

[11] Patent Number: 4,725,872

[45] Date of Patent: Feb. 16, 1988

[54] FAST CHANNEL SINGLE PHASE BURIED CHANNEL CCD

[75] Inventors: Morley M. Blouke, Beaverton; Denis L. Heidtmann, Portland, both of Oreg.

[73] Assignee: Tektronix, Inc., Beaverton, Oreg.

[21] Appl. No.: 691,605

[22] Filed: Feb. 25, 1985

[51] Int. Cl.[4] .................. H01L 29/78; H01L 29/04; H01L 29/62
[52] U.S. Cl. ............................... 357/24; 357/59; 357/71
[58] Field of Search .................. 357/23.9, 24, 59 I, 357/71; 377/57-63

[56] References Cited

U.S. PATENT DOCUMENTS

| | | | |
|---|---|---|---|
| 4,110,777 | 10/1980 | Esser et al. | 357/24 M |
| 4,229,752 | 10/1980 | Hynecek | 357/24 M |
| 4,276,557 | 6/1981 | Levinstein et al. | 357/59 I |
| 4,356,040 | 10/1982 | Fu et al. | 357/24 R |
| 4,374,700 | 2/1983 | Scott et al. | 357/59 I |
| 4,384,301 | 5/1983 | Tasch et al. | 357/23.3 |

*Primary Examiner*—Gene M. Munson
*Attorney, Agent, or Firm*—William S. Lovell; John D. Winkelman

[57] ABSTRACT

A single phase, buried channel charge coupled device has a high conductivity layer overlying the pinned regions thereof and extending to the channel stop regions, thereby facilitating the transfer of charge carriers between the channel stop regions and the pinned regions in order that the potential profile underlying said pinned regions may be more readily maintained. Extension of that high conductivity layer over the channel gate electrodes also facilitates the transmission of clocking voltages to the channel gate electrodes and allows the device to operate with decreased power losses.

4 Claims, 14 Drawing Figures

FAST CHANNEL SINGLE PHASE BURIED CHANNEL CCD

FIELD OF THE INVENTION

The subject matter of this invention relates generally to charge coupled devices, and particularly to single phase devices having buried channels and pinned regions of fixed potential.

DESCRIPTION OF THE PRIOR ART

A simple charge coupled device (CCD) may incorporate a multiplicity of cells in series, each cell having a gate electrode separated from an underlying semiconductor substrate by a thin dielectric layer. Typically, the substrate will be of p-type conductivity to yield an n-channel device, but devices of the opposite type may also be constructed. In an n-channel device, the substrate-dielectric interface defines a surface channel for electron transfer, typically bounded by parallel p+ channel stop regions. Input and output may be accomplished through externally connected n+ implant regions. Alternatively, the electronic charge to be conveyed may be created photoelectrically, as in an image array. Other methods of input or output may also be employed.

The direction of electron transfer in the CCD must then be established. If the structure itself has no directional character, that character may be imposed by external voltages. Potential energy minima for transference of the electrons may be created in the successive cells using three-phase voltage pulses on the electrodes. The relative timing of those pulses establishes the directionality.

Improvements in the CCD art have then been directed towards achieving greater speed and simplicity of operation. Lower power consumption has also been sought. However, it is also necessary to maintain signal integrity. That is, each charge transfer that occurs must be as complete as possible, in order that the signal being transmitted, whether analog or digital, will not be degraded. Compromise is then necessary, in that improvements in the CCD art with respect to power consumption and simplicity of operation have been achieved at some sacrifice in signal integrity.

In a CCD with a non-overlapping gate structure, Shimizu et al., *Applied Physics Letters*, Vol. 22, No. 6, March 1973, pp. 286-7, have pointed out that implant regions of a conductivity type opposite to that of the substrate and located under the gaps between adjacent electrodes may serve to counter the potential energy humps that would otherwise act to impede electron flow in such regions. Using an n-type substrate, ion implantation was employed under those gaps to establish first a p+ "buried channel", and then above that an n+ "channel stopper" region. The latter region serves to isolate the channel region within the gap from the potentials existing at the surface.

To increase further the speed of operation, Walden et al., *Bell System Technical Journal*, September 1972, pp. 1635-40, have described a device having buried channels beneath the electrodes. A thin layer of n-type implant at a substrate-dielectric interface of an n-channel device serves to displace the channel for electron transfer into the substrate, and thus away from the surface where a higher concentration of imperfections may act to impede the electron flow. However, such a device is found to have a smaller charge-carrying capacity than a surface channel device, as has also been shown mathematically by El-Sissi et al., *IEEE Transactions on Electron Devices*, Vol. ED-21, No. 7, July 1974, pp. 437-447. The effects described seem also to be applicable to the Shimizu et al. device.

A simpler means of operation has been found in the use of a built-in potential to define the direction of signal transfer. That potential may be created through use of a "stepped oxide" in which the dielectric layer is made thicker under one-half of the electrode area. Alternatively, one may add a p+ implant (in an n-channel device) to one-half of each cell. As noted generally by Hobson, charge-Transfer Devices, John Wiley & Sons, New York, 1978, pp. 20-23, two-phase excitation then becomes possible. However, there is then a further reduction in charge-carrying capacity, since only one-half of the applied gate voltage will act to define the difference in potential between adjacent wells. Hobson (pp. 46-7) also notes a fabrication difficulty in producing the desired lateral grading in the composition of the device.

Sequin et al., Charge Transfer Devices, Academic Press, New York, 1975, pp. 39-41, also not than an implanted barrier for defining directionality may be combined with a stepped or thick-thin oxide for providing isolation of the fixed field region. The viability of such a structure is nevertheless questioned by Sequin et al. because of the number of fabrication steps required, tight tolerances on the implants, and the low signal-handling capacity of such a device.

Simplicity of operation has been taken an additional step by Melen et al., *IEEE Journal of Solid-State Circuits*, Feb. 1972, pp. 92-3, who describe a single phase charge coupled device (SPCCD). One part of the cell is given a DC bias, and the adjacent part is then driven through a voltage range on either side of that fixed voltage. The charge-carrying capacity is then one-half of that found in the two-phase device for the same clock voltage swing.

Construction of the SPCCD, as well as operation, is made simpler by the fact that only one clocking electrode is needed for the complete signal transfer channel. The region of fixed voltage, i.e., the "pinned" region, is isolated from the external voltage so the electrode may pass right over that region. The clock circuitry required is then simpler, and the interconnections required both on and off the chip are also less complex. However, the limitation on charge-carrying capacity may not be overcome simply by increasing the gate voltage. Too high a voltage will move a buried signal transfer channel back to the semiconductor surface, thereby losing the speed advantage of the buried channel device.

U.S. Pat. No. 4,229,752 to Hynecek provides internally to the p+ implant what is equivalent to an external connection to one of the gates. That is, the implant region is connected to the bulk substrate through the channel stop regions, thus placing the implant region at a fixed or "pinned" voltage. The p+ layer at the surface of the pinned region acts as a "virtual electrode" as in the Shimizu et al. device.

The particular Hynecek device utilizes four regions of differing impurity concentration within each cell. Holes may be transferred into the pinned region from the channel stop regions. It is the transfer of holes into and out of the pinned regions which is relied upon to maintain fixed potentials therein. Such holes are presumed to be available "instantly" for such purpose, and to pass freely between the channel stop and pinned regions. Additional background comments on the device may be found in J. Hynecek, "Virtual Phase CCD Technology" Proc. 1979 Int. Elec. Dev. Meeting Washington D.C., December 1979, pp. 611–4, and "Virtual phase Technology: A New Approach to Fabrication of Large-Area CCD's", IEEE Trans. on Electron Devices, ED-28 (1981), pp. 483–489.

As noted, the foregoing developments in the CCD art have been at some cost with respect to signal integrity. A charge packet of a given size can be transferred with a high degree of completeness only by having an adequate potential difference between the adjacent regions. The buried channel device improves upon the surface channel device in terms of charge transfer rate, but at some cost in the magnitude of the charge that can be transferred. Similarly, the SPCCD accomplishes considerable simplification in the use of CCD components, but again at a cost in charge-carrying capacity. Hynecek has recognized the need to maintain the potential profile of the pinned region in order to avoid signal degradation, but beyond that there has been little attention given to the effect that the magnitude of the signal charge itself will have on the operation of the device.

A need then exists for a means of accomplishing high speed operation, as provided by the buried channel device, along with a more simple operation, as provided by the SPCCD, while at the same time allowing transfer without degradation of a magnitude of charge comparable to that of the basic CCD design.

SUMMARY OF THE INVENTION

The present invention provides a single phase charge coupled device (SPCCD) and a method of making the same for which the speed of operation is comparable to that of a similar multi-phase device. Such speed of operation is realized without sacrifice in the magnitude or integrity of the signal charge that can be transferred. More particularly, the invention provides structural means for maintaining a fixed potential profile within the pinned region of the semiconductor substrate. Such structural means comprise a low resistivity layer, deposited above the pinning layers which lie between the gates, and which allows the rapid transfer of holes into and out of the pinned regions in response to signal flow. Additionally, the simultaneous deposition of a low-resistivity layer onto the gates themselves provides for lower power dissipation in the transfer of clocking signals.

DETAILED DESCRIPTION

Figure 1:
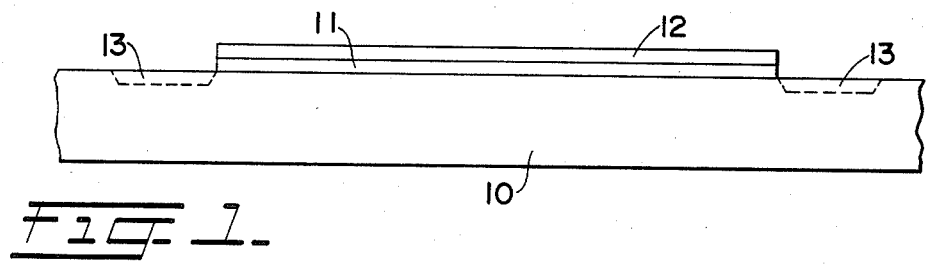
FIGS. 1 and 2 are longitudinal and transverse sectional views, respectively, of a structure from which a device according to the invention may be formed.

In the operation of an SPCCD having a pinned region, each increment of charge that enters such region tends to alter the potential profile therein. Unlike the adjacent "clocked" region, the pinned region is shielded from any applied voltage that could in principle compensate for that effect. Without such compensation, the potential well becomes more shallow, thus retarding the arrival of charge from the clocked region. A slower operating speed is then required if signal degradation is to be avoided. The operation of such an SPCCD can then be improved if means can be found to maintain the potential profile within the pinned region, e.g., beneath the p+ implant in an n-channel device unaffected by the arrival of signal charge.

The potential profile may also be affected by motion of the majority carriers within the implant. In particular, an influx of signal electrons beneath the implant, as would otherwise alter the existing potential profile, could be countered by a corresponding transfer of holes within the p+ implant. However, it is not enough simply to provide a route by which holes may reach the p+ implant. The rate at which holes can actually be delivered to the pinned region limits the rate at which such charge compensation can take place.

In general, the rate at which either holes or electrons can be transferred depends upon the sheet resistivity of the material through which they pass. At the same time, holes have an inherently lower mobility than electrons. Nevertheless, the rate of supply of holes in a medium of low resistivity could approach that of electrons in a medium in which the resistivity is higher. The present invention recognizes this principle and adapts it to the particular case of the SPCCD.

In an n-type buried channel CCD, the sheet resistivity for electron transfer is that of its channel, which typically lies within the n-type implant. In a single phase device having a pinned region, the sheet resistivity for hole transfer is that of the p+ implant which defines the pinned region. That implanted layer is necessarily quite thin, not only because it cannot be deeper than the buried channel, but also because its depth is limited by the ion implantation necessary to yield the desired potential profile. As a consequence, the resistivity of that implanted layer will usually be quite high. Instead of having a lower resistivity than the n-channel, as would be required if the rate of hole transfer were to approach that of electron transfer, the resistivity of the p+ implant will in fact be higher. That is the principal deficiency of existing SPCCD's which the present invention overcomes.

The present invention then provides a high conductivity path for hole transference within the pinned regions of n-channel (buried) single phase CCD's. The purpose of this high conductivity path is to permit the rapid transfer or flow of holes into or out of the pinned regions of the SPCCD, in response to a corresponding transfer of signal charge (electrons), thereby allowing maintenance of the potential profile in the pinned region.. The invention may also be embodied in an SPCCD of the opposite conductivity type.

In existing devices, the resistivity of the "pinning layer", i.e., the p+ implant at the surface, is found to be on the order of 27 k $\Omega$ per square. The limitation imposed by that resistivity can then be seen by calculating from it the period or frequency of operation that it will allow. Assuming a uniform period $\Delta t$ of charge transfer from the clocked to the pinned region, a first order calculation shows that in order to maintain the potential profile within that pinned region to within one volt, then $$\Delta t = n\, q\, \rho\, w^2/8$$

where n is the signal charge density, q the electronic charge, $\rho$ is the sheet resistivity in the pinned region and W is the width of the pinning layer perpendicular to the flow of charge. For $n=5\times10^{11}/cm^2$, $W=20$ μm, and using the value $\rho = 27$ kΩ per square, $\Delta t$ is approximately $10^{-9}$ sec. Such a transfer period will commence to limit the signal integrity of a device operating at 250 MHz.

The present invention then provides at the interface between the dielectric and the p+ implant region a high conductivity layer for the rapid transference of holes. Using a material such as $TiSi_2$, for which $\rho$ is approximately 50Ω per square, $\Delta t$ has a value on the order of $2\times10^{-12}$ sec, which then provides ample leeway for operating frequencies in excess of 250 MHz.

As an additional feature of the invention, the aforesaid high conductivity layer is applied at a time at which the polysilicon gate electrodes of the device are also exposed. The resistance of those electrodes is then lowered as well, so that decreased $I^2R$ losses in the electrode circuitry then tend to decrease the power dissipation of the device. An additional benefit of that higher conductivity is that it makes possible the efficient distribution of clocking signal waveforms over longer gates, thus making feasible the fabrication of larger devices.

FIG. 1 then shows in a longitudinal sectional view a structure which illustrates the initial step in fabricating a device that embodies the present invention. In this figure, the substrate 10 is of p-type silicon in the <100> orientation and has a resistivity of about 8-12 ohm-cm. Onto the substrate 10 there is formed by thermal oxidation a first silicon dioxide layer 11, of about 70 nm thickness, followed by the deposition of a 110 nm silicon nitride layer 12. Photolithography is then used to define a field implant region 13, within which the silicon nitride and silicon oxide are etched away. Into the exposed substrate 10, within the field implant region 13, B+ ions are then implanted using a beam energy of 43 keV and to a dosage of about $8\times10^{13}$ cm$^{-2}$.

Figure 2:
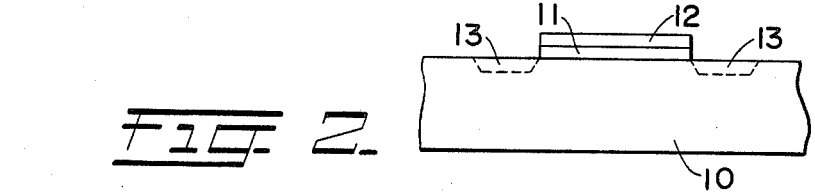
Figure 3:
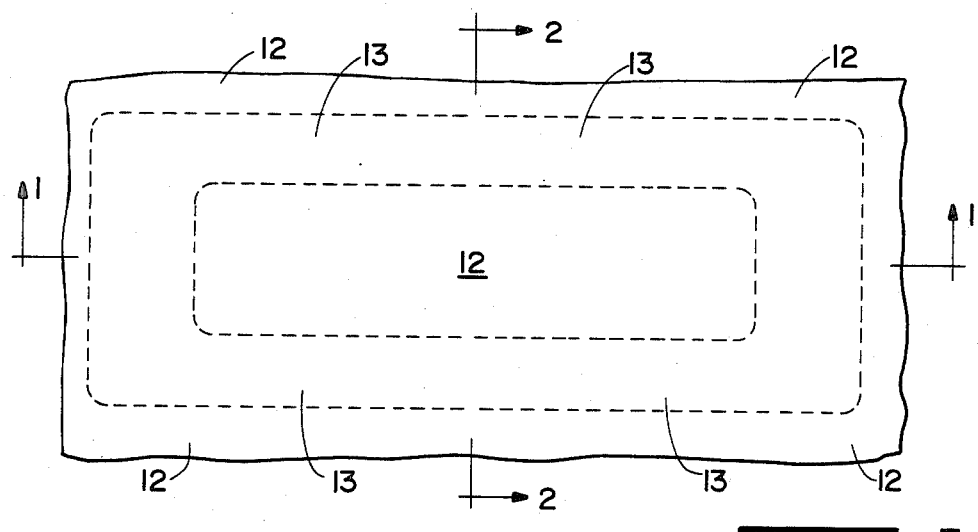
FIG. 3 is a fragmentary plan view of the structure of FIGS. 1 and 2, in which the locations of the sectional views 1—1 and 2—2 are shown.

As can be seen in FIGS. 2 and 3, the entirety of the field implant region 13 forms a "moat", within which the remaining components of the CCD may be formed. As a practical matter, that moat need not terminate at its outer periphery as shown in FIGS. 2 and 3, but may extend to the edge of the particular die. FIG. 2 shows a transverse sectional view of the same structure as shown in FIG. 1, in which the field implant region 13 may also be seen. FIG. 3 depicts a plan view of the device, and shows the field implant region 13 and the locations of the sectional views 1—1 of FIG. 1 (and of FIGS. 5-14) and 2—2 of FIG. 2 (and FIG. 4).

Figure 4:
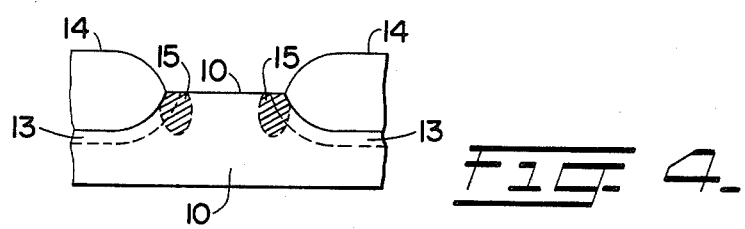
FIG. 4 is a transverse sectional view illustrating an intermediate step in a process for fabricating an embodiment of the invention.

As shown in FIG. 4, which is a transverse sectional view of the device, field oxide 14 of about 1100 nm thickness is then formed in the field implant region 13 by thermal oxidation, after which the silicon nitride layer 12 and the first silicon dioxide layer 11 are stripped away. Formation of the channel stop regions 15 which next follows may also be seen in FIG. 4. The channel stop regions 15 are defined in the longitudinal direction only, within which implantation of B+ ions is then carried out at 50 KeV and using a dosage rate of $2\times10^{13}$ cm$^{-2}$. The resultant channel stop regions 15 may also be seen in the top view of the device shown in FIG. 5.

Figure 5:
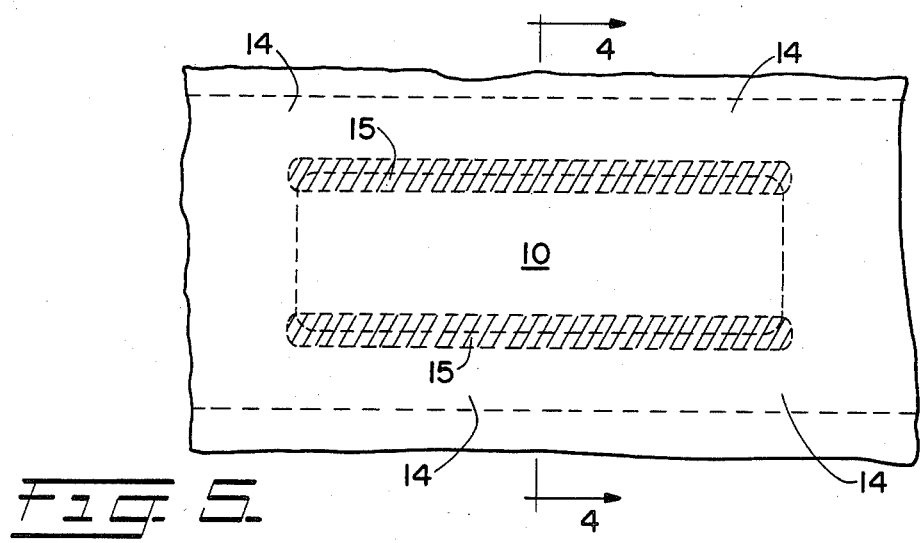
FIG. 5 is a fragmentary plan view of the structure shown in FIG. 4.
Figure 6:
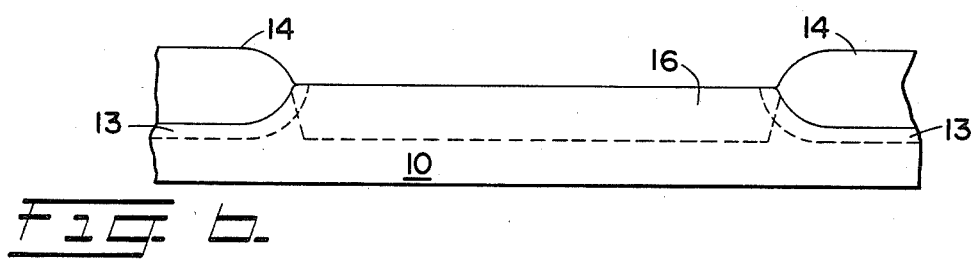
FIGS. 6–14 illustrate additional process steps in fabricating an embodiment of the invention.

To the structure of FIGS. 4 and 5 there is then added a first buried channel 16 which essentially encompasses the entire area within the moat-shaped field oxide region 14 and between the channel stop regions 15. The location of this first buried channel 16 may be seen in FIG. 6. Its area is defined photolithographically, and it is then formed by implantation of P+ ions at 180 keV and using a dosage of $2\times10^{12}$ cm$^{-2}$.

Figure 7:
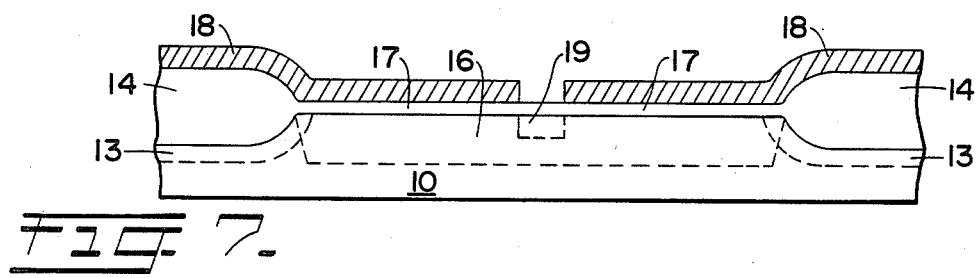

A gate oxidation process is then used to develop the structure shown in FIG. 7. Onto the area in which the first buried channel 16 has just been formed there is produced by thermal oxidation a second silicon dioxide layer 17, to a thickness of about 125 nm. A photoresist layer 18 is then applied and masked to define a second buried channel region 19, which is then formed by implantation of As+ ions at 180 keV at a dosage of $3.5\times10^{12}$ cm$^{-2}$.

Figure 8:
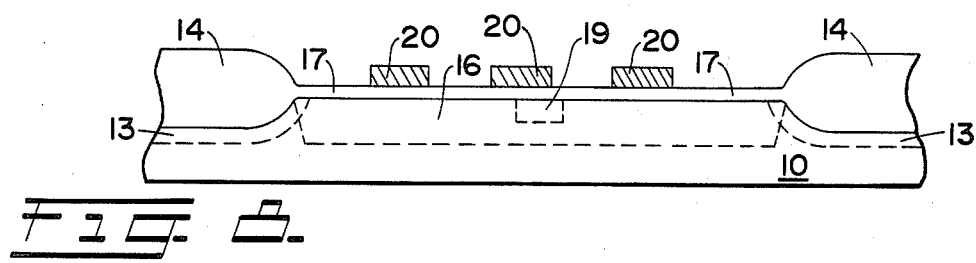

Onto the structure of FIG. 7 there is then formed a plurality of the gates 20 by which operation of the CCD is controlled. In the drawing of FIG. 8, only a representative three of such gates 20 are shown. The central of such gates, under a portion of which is formed the second buried channel 19, may be taken as representative of a plurality of such gates lying between the two outermost gates which serve for input and output. Under those outermost gates no second buried channel 19 will be formed. Formation of the gates 20 is by chemical vapor deposition (CVD) of polysilicon to about 500 nm, followed by phosphorous doping of the resultant polysilicon layer (not shown) using a $POCl_3$ atmosphere at 1000 degrees C., an additional dopant driving stage under an $N_2$ atmosphere at 1050 degrees C., and finally by photolithographic masking and etching to define the gates 20 themselves as shown in FIG. 8.

Figure 9:
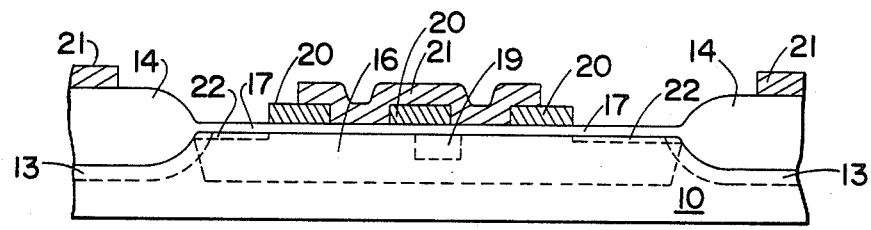

In FIG. 9 is shown the addition of the source and drain elements which will provide input and output for the device. Photoresist 21 is applied to mask that part of the substrate 10 which appears between the gates 20, while masking of the field implant regions 13 is provided by the field oxide 14. Implantation of As+ ions into the source and drain regions 22 is then carried out at 150 keV and a dosage of $1\times10^{16}$ cm$^{-2}$, followed by annealing at 600 degrees C. for 60 minutes.

Figure 10:
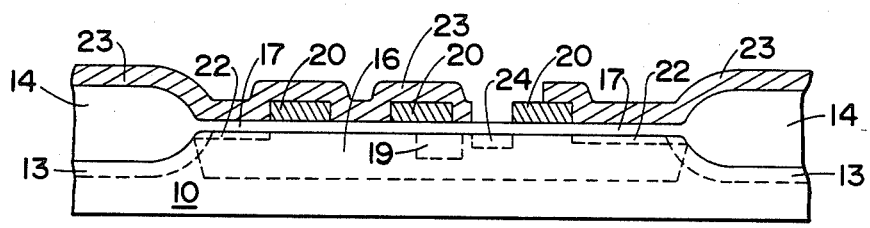
Figure 11:
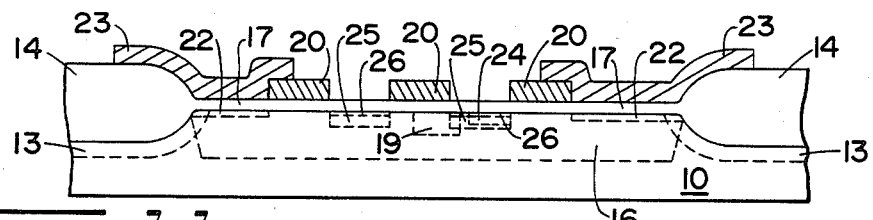
Figure 12:
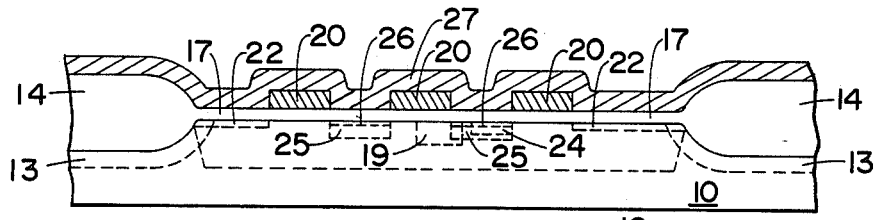

FIG. 10 then illustrates the addition of a third buried channel 24. Photoresist 21 of FIG. 9 is first stripped away, and then a new photoresist 23 is applied and masked to define the third buried channel 24, which is then formed by implantation of P+ ions at 180 keV and a dosage of $3.9\times10^{12}$ cm$^{-2}$. A second masking and etching of photoresist 23 is then used to expose all of the regions between the gates 20, as shown in FIG. 11, for the formation of a fourth buried channel 25 which is in part superimposed upon the third buried channel 24. Formation of the fourth buried channel 25 is by implantation of P+ ions at 180 keV and a dosage of $2.2\times10^{13}$ cm$^{-2}$. Onto this fourth buried channel 25 there is then added a pinning layer 26, by implantation of B+ ions at 35 keV and a dosage of $5.4\times10^{13}$ cm$^{-2}$. The function of these several buried channels in forming the appropriate potential profile in both the clocked and pinned regions may be seen in U.S. Pat. No. 4,229,752 to Hynecek. As shown in FIG. 12, the structure of FIG. 11 is then provided with an anneal cap 27, by first stripping away photoresist 23 and then applying 350 nm of $SiO_2$ using CVD, following which annealing is carried out.

Figure 13:
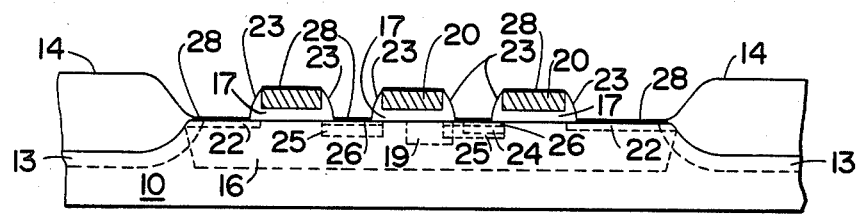

Following the annealing process, reactive ion etching (RIE) is used to expose the source and drain regions 22 and the pinning layers 26 at the surface of the substrate 10, as well as the tops of the gates 20. The RIE process removes the greater part of the anneal cap 27 as well as the exposed portions of the second silicon dioxide layer 17, but leaves CVD oxide walls as a remnant of the anneal cap 27 on both sides of each of the gates 20, as shown in FIG. 13. Onto the source and drain regions 22, the pinning layers 26, and the tops of each of the gates 20 there is then deposited 40 nm of Ti followed by 10 nm of Mo. The structure so formed is then annealed at 590 degrees C. for one-half hour in a reducing atmosphere of $H_2$ and $N_2$, resulting in the formation upon the surfaces of the source and drain regions 22, the pinning layers 26, and the gates 20, of a $TiSi_2$ layer 28. The unreacted Ti and the Mo are then etched away and the structure is again annealed at 800 degrees C. for one-half hour, under an atmosphere of $N_2$. As noted earlier, the $TiSi_2$ layer 28 serves to provide a low-resistivity path both for hole transfer into and out of the clocked region under the gates 20 and for hole motion within the pinning layer 26, as well as to decrease the resistance in the transmission of clocking signals to the gates 20.

Figure 14:
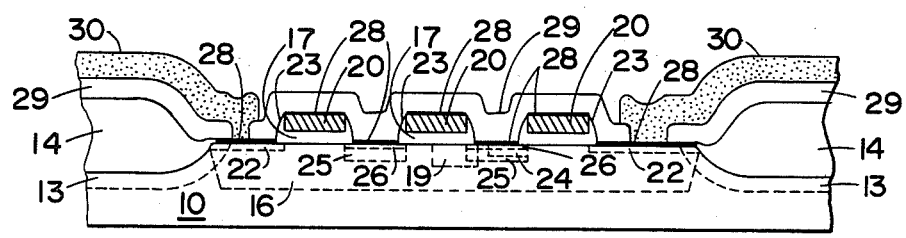

To form the final structure of FIG. 14, the structure of FIG. 13 is first provided with an undoped CVD oxide overcoat 29 of about 1800 nm thickness. Photolithography is then employed to define apertures to the source and drain regions 22, and within those apertures the overcoat layer 29 is etched away. Ohmic contact to the source and drain regions 22 is provided by P+ doping of the exposed contact area, using $POCl_3$, followed by a second masking and deposition of Al to yield the source and drain contacts 30. Finally, the Al contacts 30 are annealed and sintered at 450 degrees C. for 30 minutes under an atmosphere of $H_2$ and $N_2$.

In the structure of FIG. 14, the high conductivity $TiSi_2$ layer 28 has been placed into a CCD having a complex structure of buried channels. However, it will be clear to those skilled in the art that the present invention is not limited to the particular embodiment described herein. For example, the high conductivity layer to be employed need not be of $TiSi_2$, but need only be of a material of appropriate low resistivity that can be formed above the pinning layer in the manner of the present embodiment. In addition, to employ this invention, it is only necessary that the CCD into which the high conductivity layer is to be embodied have appropriate pinned and clocked regions, and that the pinned region have access, in the manner of the Hynecek patent, to a source of charge carriers that can serve to eliminate the effect of the signal charges being transmitted upon the potential profiles of the pinned and clocked regions. The scope of the present invention, therefore, should not be limited by the description given herein, but rather is to be derived from the claims appended hereto and the equivalents thereof.

We claim:

1. An improved single-phase, buried channel charge coupled device of the type having
    a substrate of p-type silicon having positive majority charge carriers therein and serving as a source thereof, said substrate having a main face and an n-type buried channel formed subjacent thereto and having negative majority carriers therein and serving as a source thereof, and defining therein
    at least one charge transfer cell having first and second adjoining regions, each bounded by said main face,
    associated with said charge transfer cell and disposed over at least that portion of said main face which overlies said first region, a channel gate electrode in electrically insulating relationship with said substrate region,
    means for applying an electrical potential to said channel gate electrode,
    whereby a change in the electrical potential of said electrode brings about a corresponding change in potential in at least said first region,
    said first region comprising first and second zones of greater and lesser potential, respectively, with respect to negative charge carriers, said second zone being between said first zone and said second region, and
    said second region comprising third and fourth zones of greater and less potential, respectively, with respect to negative charge carriers, said third zone being between said second zone and said fourth zone,
    said charge coupled device also including a source of positive charge carriers, and
    said second region including immediately beneath said main face a p-type layer so that the second region is shielded from electric fields above said main face, said layer also being connected to said source of charge carriers and providing positive charge carriers to said layer in order to maintain the potential within said second region upon entry of negative charge carriers into the second region,
    whereby a change in the potential of said electrode brings about a corresponding change in potential of the first and second zones, so that in a first condition the potentials of the first and second zones are greater than those of the third and fourth zones, and in a second condition the potentials of the first and second zones are less than those of the third and fourth zones,
    the improvement comprising a layer of titanium silicide formed in a first portion thereof at said main face of the substrate overlying the layer of said first conductivity type and in electrical connection with said source of positive charge carriers, whereby the transfer of said positive charge carriers between said source and said p-type layer will be facilitated.

2. A device according to claim 1, wherein said channel gate electrode comprises a layer of conductive material having an inner surface directed towards said main face and also having an outer surface, and wherein said device further comprises a layer of said material of high electrical conductivity formed in a second portion thereof on the outer surface of said channel gate electrode.

3. A device according to claim 1 wherein said charge coupled device comprises a multiplicity of said charge transfer cells, disposed in a mutually adjacent relationship such that each of said first regions thereof is disposed in a mutually spaced relationship therebetween, separated in each case by each of said second regions, also disposed in a mutually spaced relationship therebetween.

4. A device according to claim 1 wherein said channel gate electrode comprises a layer of polysilicon containing an amount of n-type impurity therein as will significantly decrease the resistivity thereof, said channel gate electrode further having an inner surface directed towards said main face and also having an outer surface and a layer of titanium silicide on said outer surface.

* * * * *